United States Patent
Eguchi et al.

(10) Patent No.: US 10,420,268 B2
(45) Date of Patent: Sep. 17, 2019

(54) COMPONENT SUPPLY SYSTEM AND COMPONENT SUPPLY METHOD

(71) Applicant: Panasonic Intellectual Property Management Co., Ltd., Osaka (JP)

(72) Inventors: Ryouji Eguchi, Yamanashi (JP); Kazunori Kanai, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 19 days.

(21) Appl. No.: 15/204,016

(22) Filed: Jul. 7, 2016

(65) Prior Publication Data
US 2017/0034969 A1  Feb. 2, 2017

(30) Foreign Application Priority Data
Jul. 29, 2015  (JP) ................ 2015-149112

(51) Int. Cl.
*H05K 13/04* (2006.01)
*B65H 37/00* (2006.01)
*H05K 13/02* (2006.01)
*H05K 13/08* (2006.01)

(52) U.S. Cl.
CPC ....... *H05K 13/0417* (2013.01); *B65H 37/002* (2013.01); *H05K 13/0215* (2018.08); *H05K 13/0419* (2018.08); *H05K 13/0813* (2018.08); *B65H 2701/1942* (2013.01)

(58) Field of Classification Search
CPC .. B65H 2301/46011; B65H 2301/4602; B65H 37/002; H05K 13/02; H05K 13/021; H05K 13/0417; H05K 13/08

USPC ................................ 156/361, 367, 368
See application file for complete search history.

(56) References Cited

U.S. PATENT DOCUMENTS

2010/0290885 A1* 11/2010 Kou ............... B65H 26/02
                                                  414/751.1
2011/0243695 A1  10/2011 Hwang et al.

FOREIGN PATENT DOCUMENTS

| CN | 202931739 U | 5/2013 |
| CN | 103202109 A | 7/2013 |
| JP | 2005-123302 A | 5/2005 |
| JP | 2007-188929 A | 7/2007 |

(Continued)

OTHER PUBLICATIONS

Translation of JP 2012104635 A, May 2012, Kobayashi, Hitoshi.*
Chinese Search Report dated Jul. 9, 2019 for the related Chinese Patent Application No. 201610585548.6.

*Primary Examiner* — George R Koch
(74) *Attorney, Agent, or Firm* — Pearne & Gordon LLP

(57) ABSTRACT

A component supply system of the present disclosure includes a component supply unit automatically transfers a first carrier tape which stores components and is covered with a cover tape, exposes the components from the first carrier tape using a component exposing unit, and supplies the components which are exposed from the first carrier tape, a joining determination unit which determines whether or not a joining which joins a second carrier tape positioned behind the first carrier tape to the first carrier tape is present, and a controller which controls transferring of the first carrier tape by the component supply unit. The controller restricts the transferring of the first carrier tape in a case in which the joining determination unit determines that the joining is present.

15 Claims, 15 Drawing Sheets

(56) References Cited

FOREIGN PATENT DOCUMENTS

| JP | 2011-211169 | | 10/2011 | | |
|---|---|---|---|---|---|
| JP | 2012104635 | A * | 5/2012 | ........... | H05K 13/021 |
| JP | 2013-197448 | A | 9/2013 | | |
| JP | 2014-175481 | A | 9/2014 | | |

* cited by examiner

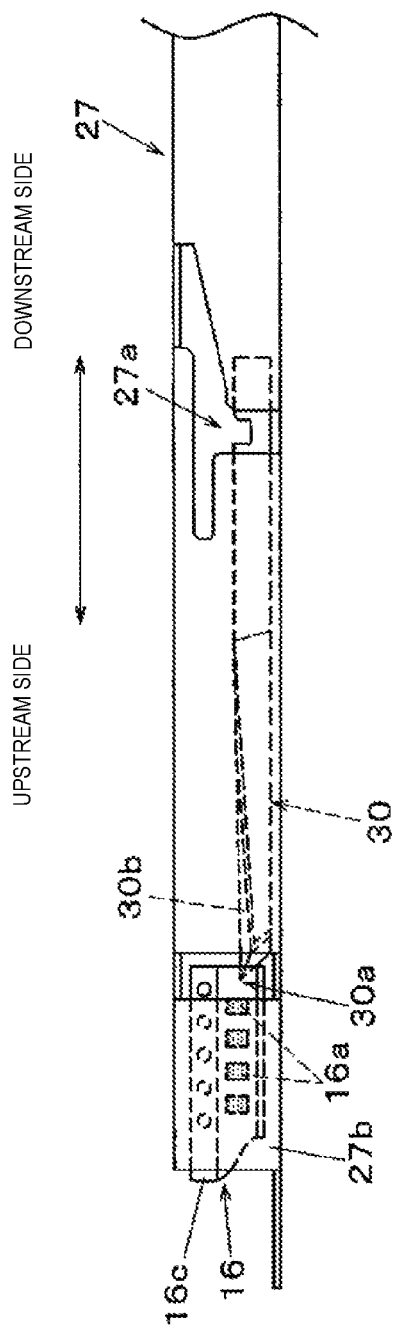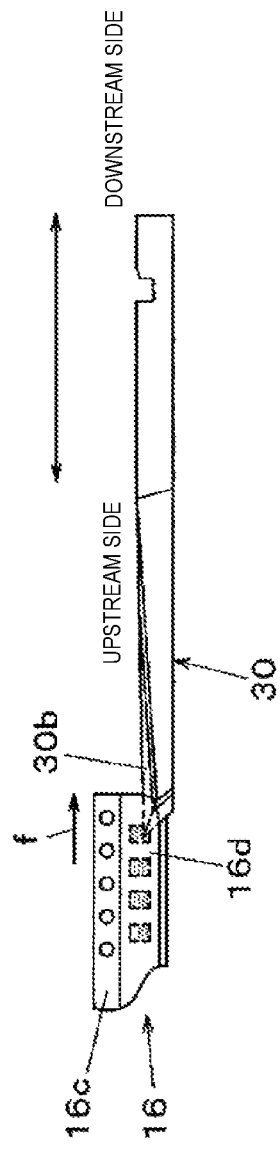

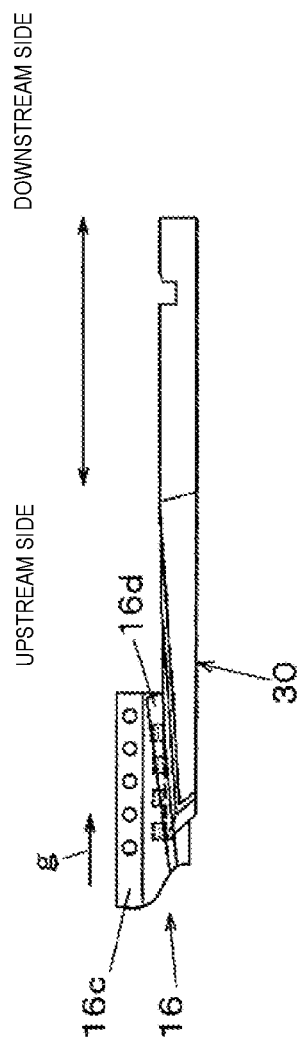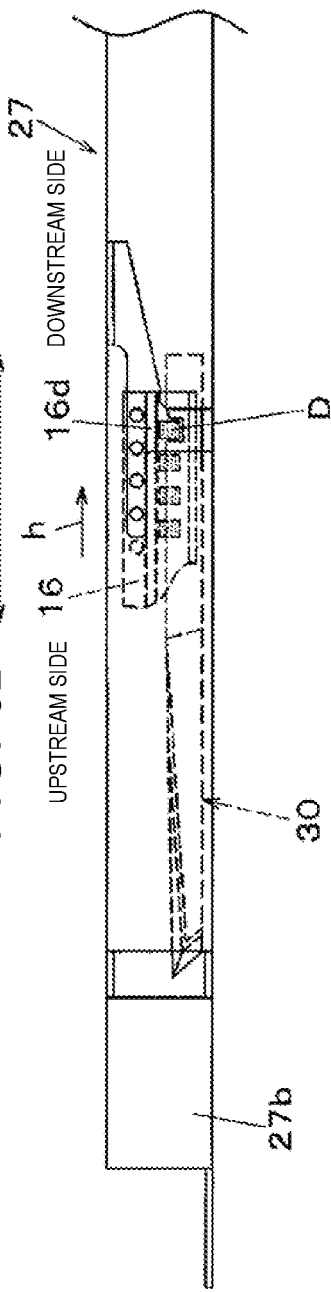
FIG. 6C
FIG. 6D

FIG. 10A

| SUPPLY REEL INFORMATION | | | 32b |
|---|---|---|---|
| REEL ID | LEADING TAPE COMPONENT ID (1) | FOLLOWING TAPE COMPONENT ID (2) | |
| Raaaa | T1aaa | — | |
| Rbbbb | T1bbb | — | |
| Rcccc | T1ccc | T2ccc | |
| Rdddd | T1ddd | — | |
| ⋮ | | | |

| COMPONENT DISPOSITION DATA | | | | 32c |
|---|---|---|---|---|
| FEEDER ADDRESS | FEEDER ID | LEADING TAPE REEL ID (1) | FOLLOWING TAPE REEL ID (2) | |
| f1 | Faaaa | Raaaa | — | |
| f2 | Fbbbb | Rbbbb | Rdddd | |
| f3 | Fcccc | Rcccc | — | |
| ⋮ | | | | |

↑ 43    ↑ 44    ↑ 41(1)    ↑ 41(2)

COMPONENT SUPPLY SYSTEM AND COMPONENT SUPPLY METHOD

BACKGROUND OF THE INVENTION

1. Field of the Invention

The present disclosure relates to a component supply system and a component supply method which pitch feed a carrier tape in which components are stored.

2. Description of the Related Art

A tape feeder is known as a supply device of components in a component mounter. The tape feeder supplies a component to a component adherence position of a mounting head of a component mounting mechanism by pitch feeding a carrier tape holding the component. Tape splicing in which a following new carrier tape (a following tape) is connected to the tail of a leading mounted carrier tape (a leading tape) is used as a method of continuing component supply in a successive manner without stopping a mounting operation in the tape feeder.

In this tape splicing system, it is necessary for a worker to execute troublesome work every time the supply reel is exchanged, and there is a demand to reduce this workload. Therefore, an automatic loading tape feeder in which a following tape is set in the tape feeder, is automatically loaded, and the carrier tape is pitch fed without performing tape splicing work is used as a tape loading system (for example, refer to Japanese Patent Unexamined Publication No. 2011-211169).

The carrier tape is configured such that a base tape which stores the components is covered with a cover tape, and it is necessary to expose the component by peeling the cover tape while the component is pitch fed to the component adherence position. The related art disclosed in Japanese Patent Unexamined Publication No. 2011-211169 includes a component exposing unit having a peeling blade, and the component is exposed by peeling the cover tape from the carrier tape which is pitch fed by inserting the peeling blade between the base tape and the cover tape.

SUMMARY OF THE INVENTION

A component supply system of the present disclosure includes a component supply unit automatically transfers a first carrier tape which stores components and is covered with a cover tape, exposes the components from the first carrier tape using a component exposing unit, and supplies the components which are exposed from the first carrier tape, a joining determination unit which determines whether or not a joining which joins a second carrier tape positioned behind the first carrier tape to the first carrier tape is present, and a controller which controls transferring of the first carrier tape by the component supply unit. The controller restricts the transferring of the first carrier tape in a case in which the joining determination unit determines that the joining is present.

A component supply method of the present disclosure is a method in a component supply system including a component supply unit automatically transfers a first carrier tape which stores components and is covered with a cover tape, exposes the components from the first carrier tape using a component exposing unit, and supplies the components which are exposed from the first carrier tape, the method including determining whether or not a joining which joins a second carrier tape positioned behind the first carrier tape to the first carrier tape is present, and restricting transferring of the first carrier tape in a case in which the joining is determined to be present.

BRIEF DESCRIPTION OF DRAWINGS

FIG. 6A is an explanation diagram of a cover tape peeling operation of a cover tape peeler of the tape feeder of an embodiment of the present disclosure;

FIG. 6B is an explanation diagram of a cover tape peeling operation of the cover tape peeler of the tape feeder of an embodiment of the present disclosure;

FIG. 6C is an explanation diagram of the cover tape peeling operation of the cover tape peeler of the tape feeder of an embodiment of the present disclosure;

FIG. 6D is an explanation diagram of the cover tape peeling operation of the cover tape peeler of the tape feeder of an embodiment of the present disclosure;

FIG. 10A is a configuration explanation diagram of supply reel information used by the component mounting line of an embodiment of the present disclosure;

FIG. 10B is a configuration explanation diagram of component disposition data used by the component mounting line of an embodiment of the present disclosure;

DETAILED DESCRIPTION OF THE PREFERRED EMBODIMENTS

Before describing the embodiments of the present disclosure, a concise description will be given of the problems in the device of the related art.

A carrier tape which is subjected to tape splicing being loaded into the automatic loading tape feeder in the related art including Japanese Patent Unexamined Publication No. 2011-211169 is not anticipated. Therefore, when the carrier tape which is subjected to tape splicing is unintentionally loaded into the automatic loading tape feeder, there is a problem in that the peeling blade of the component exposing unit may be broken by splicing tape.

Next, description will be given of the embodiments of the present disclosure.

Figure 2:
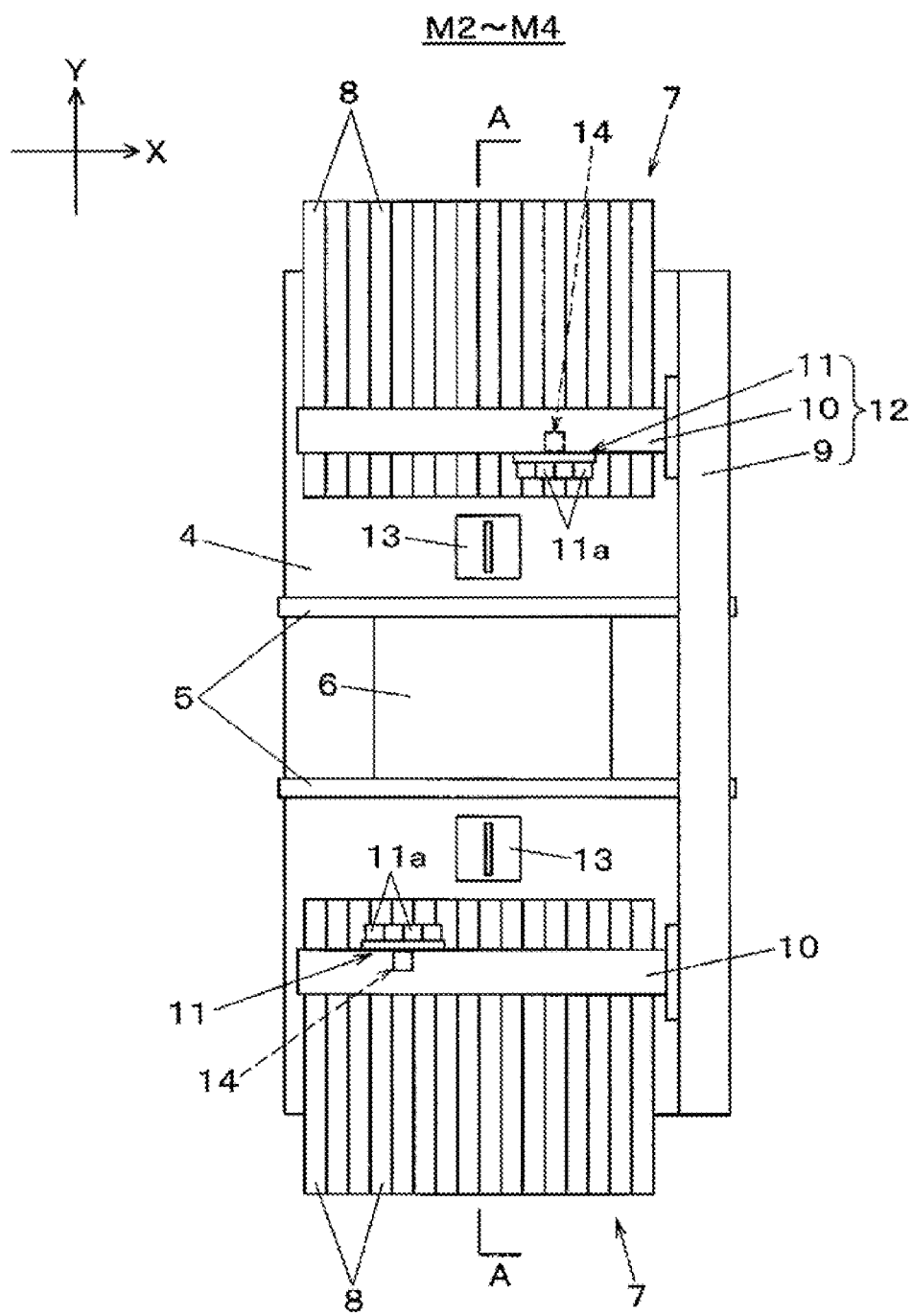
FIG. 2 is a plan view of a component mounter of an embodiment of the present disclosure.
Figure 3:
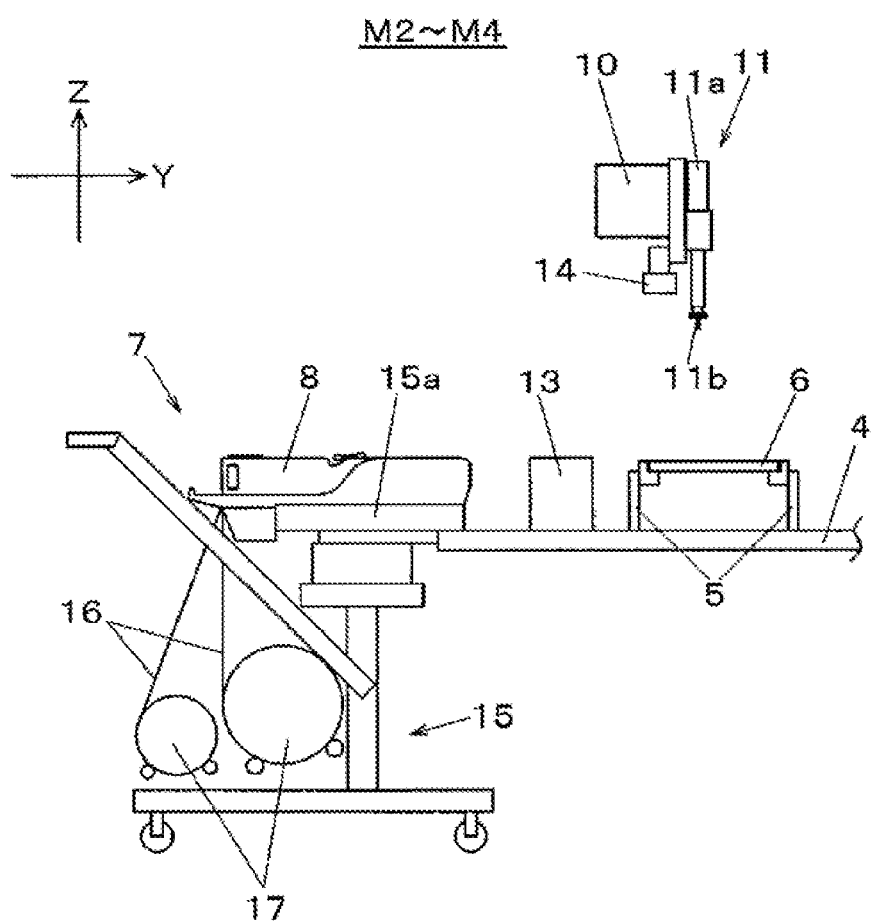
FIG. 3 is a partial sectional diagram of the component mounter of an embodiment of the present disclosure.

Hereinafter, detailed description will be given of an embodiment of the present disclosure using the drawings. The configurations, forms, and the like described hereinafter are examples to facilitate explanation, and may be modified, as appropriate, according to the design of the component mounting line. Hereinafter, elements corresponding to each other are given the same symbols in all of the drawings, and duplicated description is omitted. An X direction (the left-right direction in FIG. 2) in the board conveyance direction and a Y direction (the front-back direction in FIG. 2) perpendicular to the board conveyance direction are illustrated in FIG. 2 and some parts described later as two axial directions which orthogonally intersect each other in a horizontal plane. A Z direction is illustrated in FIG. 3 and some parts described later as a height direction which orthogonally intersects the horizontal plane. The Z direction is an up-down direction or a perpendicular direction in a case in which the component mounting line is installed on the horizontal plane.

Figure 1:
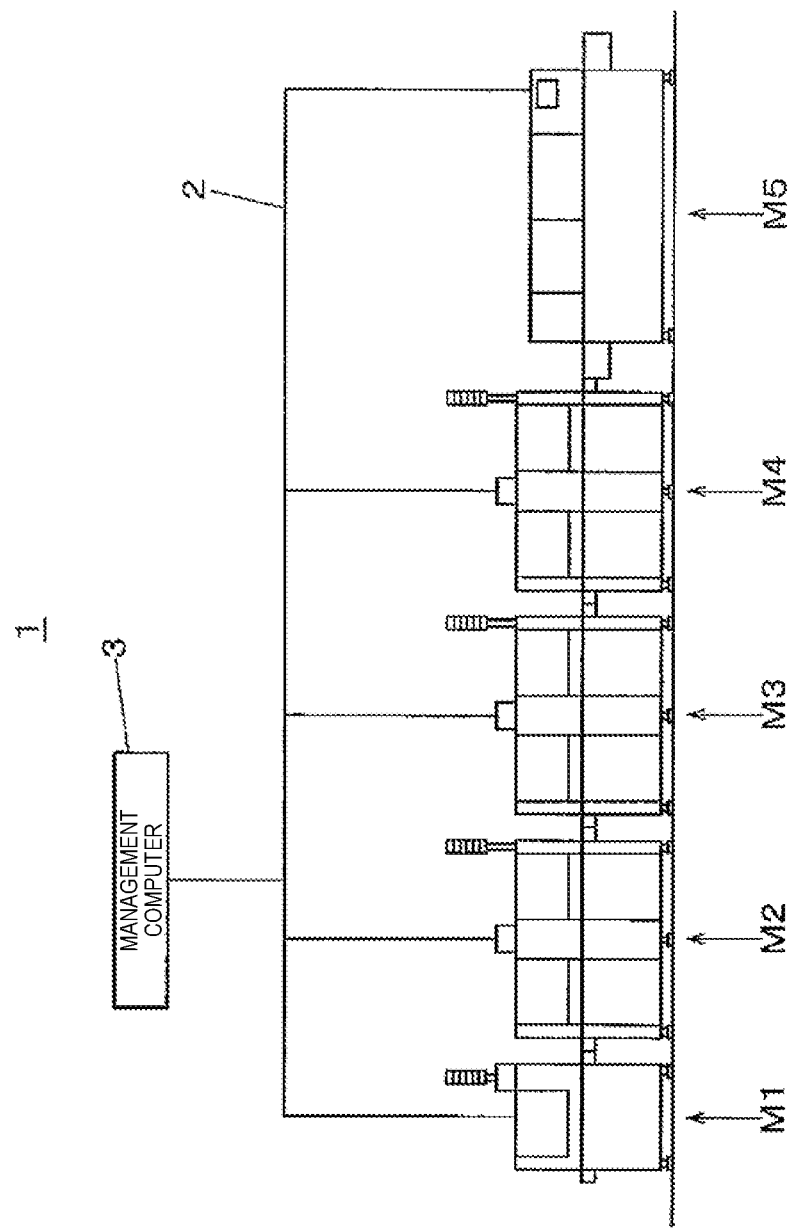
FIG. 1 is a configuration explanation diagram of a component mounting line of an embodiment of the present disclosure.

First, description will be given of the component mounting line with reference to FIG. 1. Component mounting line 1 in FIG. 1 includes a function of manufacturing a mounted board by mounting components onto a board. Component mounting line 1 is configured to join each device of printer M1, component mounters M2 to M4, and reflow device M5, to each other using communication network 2, and to perform overall control using management computer 3. Printer M1 screen prints paste-form solder onto electrodes for component connection which are formed on the board. Component mounters M2 to M4 perform component mounting work of picking up a component from a part feeder such as tape feeders which are arranged in a component supply unit and transferring and placing the component on the board using a mounting head. Reflow device M5 solders the terminals of the components which are placed on the board to the electrodes of the board by melting the solder.

Next, description will be given of the configuration of component mounters M2 to M4 with reference to FIGS. 2 and 3. FIG. 3 partially illustrates the cross-section taken along line A-A in FIG. 2. In FIG. 2, board conveyance mechanism 5 is arranged in the X direction in the center of table 4. Board conveyance mechanism 5 conveys board 6 which is carried in from the upstream side, and positions and holds board 6 on a mounting stage which is set in order to execute component mounting work. Component supply units 7 are disposed on either side of board conveyance mechanism 5, and a plurality of tape feeders 8 are mounted in parallel in each component supply unit 7. Tape feeder 8 supplies a component to a component adherence position of a mounting head of a component mounting mechanism described hereinafter by pitch feeding a carrier tape storing components in a tape feed direction.

Y-axis moving table 9 including a linear drive mechanism is arranged on the end of one side on the top surface of table 4 in the X direction. Two X-axis moving tables 10 similarly including linear drive mechanisms are joined to Y-axis moving table 9 to be freely movable in the Y direction. Mounting head 11 is mounted on each of two X-axis moving tables 10 to be freely movable in the X direction. Mounting head 11 is a multi-head mounting head including a plurality of holding heads 11a, and, as illustrated in FIG. 3, vacuum nozzles 11b which adhere to and hold components and are capable of being lifted and lowered individually are mounted to the bottom end of each holding head 11a.

Mounting head 11 moves in the X direction and the Y direction due to Y-axis moving table 9 and X-axis moving table 10 being driven. Accordingly, two mounting heads 11 adhere to, hold, and pick up components from the component adherence positions of tape feeders 8 disposed on component supply units 7 corresponding to each mounting head 11 using vacuum nozzles 11b, and move and place the components on mounting points on board 6 which is positioned in board conveyance mechanism 5. Y-axis moving table 9, X-axis moving table 10, and mounting head 11 form component mounting mechanism 12 which moves and places components onto board 6 by moving mounting heads 11 holding components.

Component recognition camera 13 is arranged between component supply unit 7 and board conveyance mechanism 5. When mounting head 11 which picked the component from component supply unit 7 moves above component recognition camera 13, component recognition camera 13 images the component in the state of being held by mounting head 11 and recognizes the holding orientation of the component. Board recognition cameras 14 which move integrally with each mounting head 11 are mounted to the bottom surface of X-axis moving table 10.

Due to the movement of mounting head 11, board recognition camera 14 moves above board 6 which is positioned in board conveyance mechanism 5, and board recognition camera 14 images board 6 and recognizes the state of board 6. In a component mounting operation to board 6 carried out by mounting head 11, placement position correction is performed, taking into account recognition results of the component by component recognition camera 13 and board recognition results by board recognition camera 14.

As illustrated in FIG. 3, carriage 15 is set in component supply unit 7 in a state in which a plurality of tape feeders 8 are mounted to feeder base 15a in advance. Feeder addresses for specifying a feeder position at which each individual tape feeder 8 is mounted are set in feeder base 15a, and in the component mounting work, each tape feeder 8 on feeder base 15a is specified via these feeder addresses.

The position of carriage 15 on component supply unit 7 is fixed by clamping feeder base 15a to table 4 using a clamp mechanism (not illustrated). Supply reels 17 storing carrier tapes 16 in a wound state are held in carriage 15, and carrier tapes 16 hold the components. Carrier tape 16 which is pulled out from supply reel 17 is pitch fed by tape feeder 8 to the component adherence position of vacuum nozzle 11b.

Figure 4:
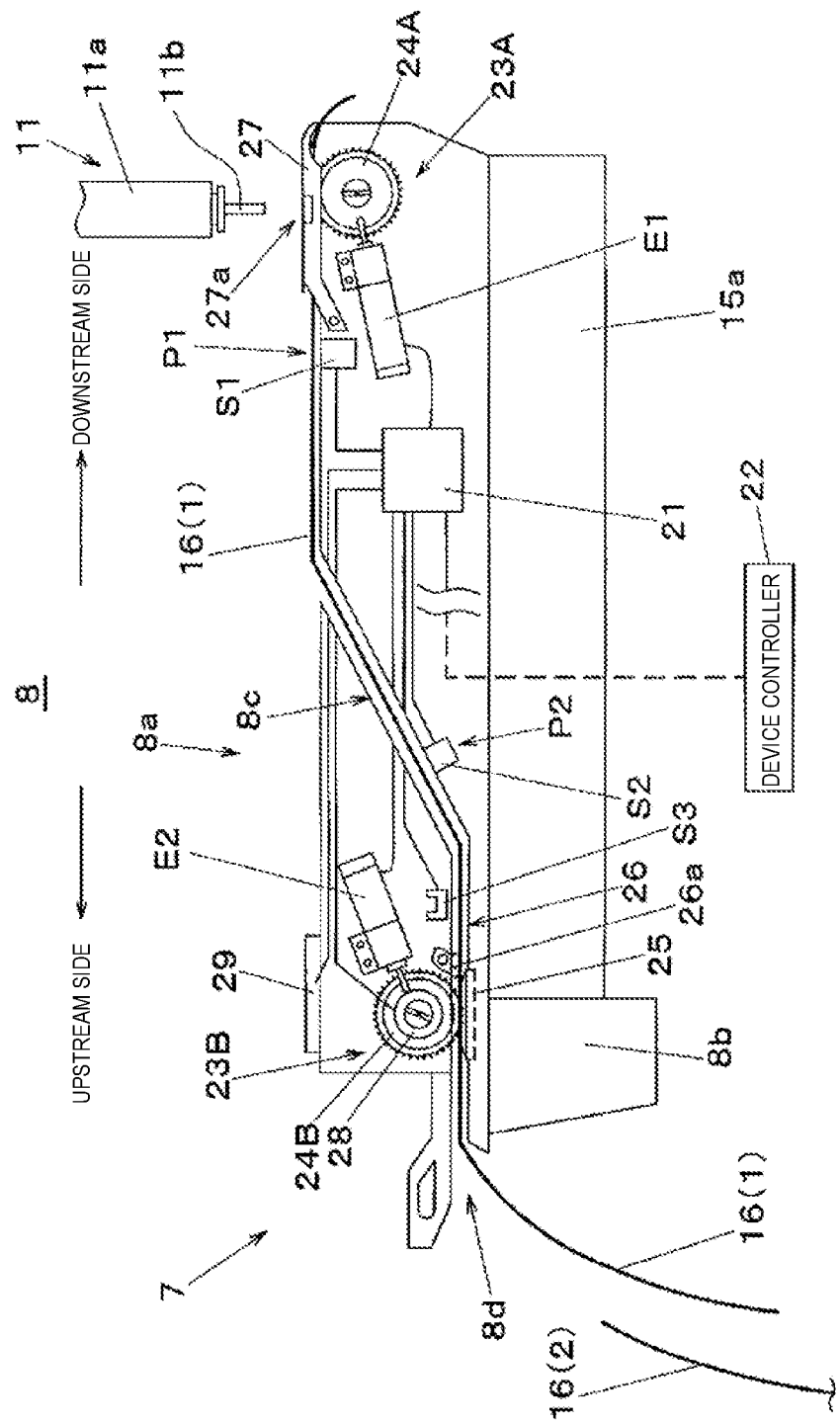
FIG. 4 is a configuration explanation diagram of a tape feeder of an embodiment of the present disclosure.

Next, description will be given of the configuration and functions of tape feeder 8 with reference to FIG. 4. As illustrated in FIG. 4, tape feeder 8 is configured to include mounting portion 8b which protrudes downward from main body portion 8a and the bottom surface of main body portion 8a. In a state in which tape feeder 8 is mounted with the bottom surface of main body portion 8a aligned with feeder base 15a, tape feeder 8 is fixed and mounted to component supply unit 7, and feeder controller 21 which is embedded in order to control the tape feeding in tape feeder 8 is electrically connected to device control unit 22 of component mounters M2 to M4.

Tape guideway 8c is provided inside main body portion 8a and guides carrier tape 16 which is pulled out from supply reel 17 and taken into main body portion 8a. Tape guideway 8c is provided to communicate from insertion port 8d to the component adherence position at which mounting head 11 picks up the components. Insertion port 8d is opened at the upstream end of main body portion 8a in the tape feed direction and carrier tape 16 is inserted therethrough. In the process of successively executing the component mounting work, the plurality of carrier tapes 16 are sequentially inserted from insertion port 8d to be supplied to tape feeder 8.

Tape feeder 8 illustrated in the present embodiment adopts a non-splicing system (an automatic loading system) in which two carrier tapes 16 which are transported one after the other are supplied by being sequentially inserted into insertion port 8d in a state of being separated from each other. Therefore, it is not necessary to join the tail end of carrier tape 16(1) (hereinafter shortened to leading tape 16(1)) to the leading end of carrier tape 16(2) (hereinafter shortened to following tape 16(2)) using bonding tape. Carrier tape 16(1) is already mounted to tape feeder 8 and is the component removal target of mounting head 11, and carrier tape 16(2) is newly added and mounted when the components are depleted.

In FIG. 4, first tape feed mechanism 23A and second tape feed mechanism 23B for tape feeding leading tape 16(1) and following tape 16(2) are arranged on the downstream side and the upstream side in tape guideway 8c, respectively. Second tape feed mechanism 23B which is provided on the upstream side includes a function of successively tape feeding following tape 16(2) which is newly mounted from insertion port 8d side to first tape feed mechanism 23A side. Second tape feed mechanism 23B is configured to rotationally drive sprocket 24B using second motor E2.

Tape pushing mechanism 25 and tape stopper mechanism 26 are arranged below second tape feed mechanism 23B. Following tape 16(2) inserted through insertion port 8d is pushed into sprocket 24B by tape pushing mechanism 25, and thus, following tape 16(2) engages with sprocket 24B and enters a state in which tape feeding by second tape feed mechanism 23B is possible. Tape stopper mechanism 26 includes a function of temporarily stopping the leading end of following tape 16(2), which is newly inserted in a state in which leading tape 16(1) is mounted, using stopper member 26a.

First tape feed mechanism 23A which is provided on the downstream side includes a function of pitch feeding leading tape 16(1) to the component adherence position of mounting head 11 at a predetermined feed pitch. First tape feed mechanism 23A is configured to rotationally drive sprocket 24A using first motor E1. Retaining member 27 which retains leading tape 16(1) from above and exposes the components stored in leading tape 16(1) is mounted above first tape feed mechanism 23A. The component which is pitch fed to the component adherence position is picked up by vacuum suction using vacuum nozzle 11b of mounting head 11 via component pickup opening 27a formed in retaining member 27.

Figure 5A:
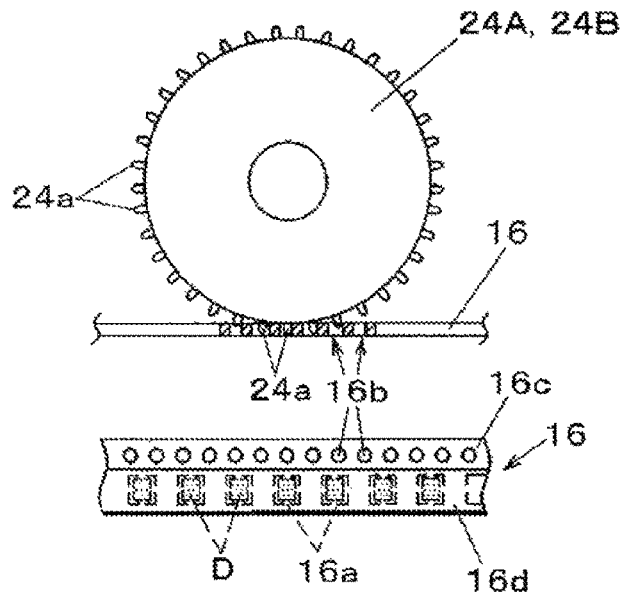
FIG. 5A is a function explanation diagram of a sprocket used in a tape feed mechanism in the tape feeder of an embodiment of the present disclosure.

Here, description will be given of the functions of sprockets 24A and 24B with reference to FIGS. 5A to 5C. As illustrated in FIG. 5A, a plurality of feed pins 24a are provided on the outer circumferential surfaces of sprockets 24A and 24B. Carrier tape 16 is formed of base tape 16c and cover tape 16d. Component pockets 16a which store supply-target components D and feed holes 16b with which feed pins 24a engage are formed at a predetermined pitch in base tape 16c, and cover tape 16d covers component pockets 16a. In other words, carrier tape 16 stores components D and covers components D with cover tape 16d. Carrier tape 16 is tape fed due to sprockets 24A and 24B rotating in a state in which feed pins 24a are engaged with feed holes 16b.

Figure 5B:
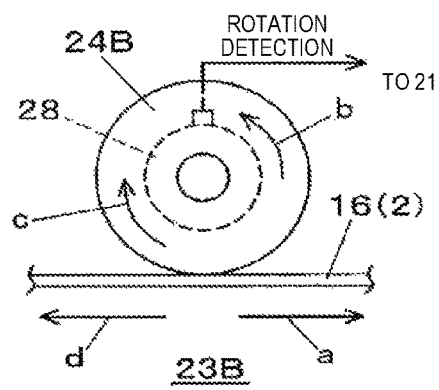
FIG. 5B is a function explanation diagram of a sprocket used in a tape feed mechanism in the tape feeder of an embodiment of the present disclosure.

FIG. 5B illustrates the function of sprocket 24B in second tape feed mechanism 23B. As described earlier, sprocket 24B successively tape feeds following tape 16(2) due to being rotationally driven by second motor E2. Regarding this drive system, when second motor E2 is in an unexcited state of not being subjected to drive control, the idling of sprocket 24B is allowed (idling mode), and the movement of following tape 16(2) which is in an engaged state with sprocket 24B is also allowed. Encoder 28 is embedded in sprocket 24B as a rotation detection unit, and when following tape 16(2) moves in the downstream direction (arrow a), sprocket 24B rotates in the forward direction (arrow b), and a rotation detection signal corresponding to the rotation state is transmitted to feeder controller 21.

When rotation in the forward direction (arrow b direction) of sprocket 24B is detected, feeder controller 21 determines that a new carrier tape 16 is inserted, and starts the driving of second motor E2 in order to perform the tape feeding. Accordingly, the inserted carrier tape 16 is fed to the downstream side along tape guideway 8c (forward rotation mode). According to instructions from feeder controller 21, it is possible for second tape feed mechanism 23B to drive second motor E2 in the reverse direction to cause sprocket 24B to rotate in the reverse direction (arrow c). Accordingly, carrier tape 16 which engages with sprocket 24B is conveyed to the upstream side (arrow d) (reverse rotation mode).

Figure 5C:
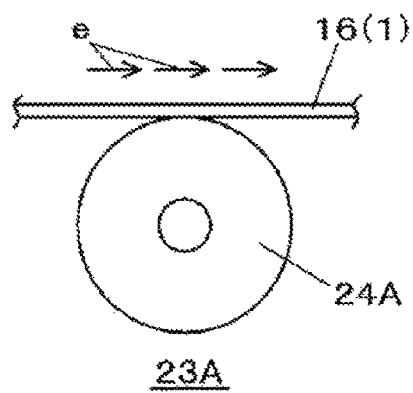
FIG. 5C is a function explanation diagram of a sprocket used in the tape feed mechanism in the tape feeder of an embodiment of the present disclosure.

FIG. 5C illustrates the function of sprocket 24A in first tape feed mechanism 23A. As described earlier, sprocket 24A pitch feeds (arrow e) leading tape 16(1) by a predetermined feed pitch due to being intermittently driven by first motor E1. Accordingly, component D which is stored in component pocket 16a of carrier tape 16 is supplied to the component adherence position.

In FIG. 4, first detection position P1 for detecting carrier tape 16 is set at the upstream side of first tape feed mechanism 23A and retaining member 27 in tape guideway 8c. Similarly, second detection position P2 for detecting carrier tape 16 is set on the downstream side of second tape feed mechanism 23B and the upstream side of first detection position P1. First sensor S1 and second sensor S2 which are arranged at first detection position P1 and second detection position P2, respectively, detect whether or not carrier tape 16 is present in first detection position P1 and second detection position P2.

Third sensor S3 which detects that following tape 16(2) abuts stopper member 26a is arranged in tape stopper mechanism 26. The detection results of first sensor S1, second sensor S2, and third sensor S3 are transmitted to feeder controller 21, and feeder controller 21 controls first tape feed mechanism 23A and second tape feed mechanism 23B based on these detection results and the rotation detection results of encoder 28. Accordingly, the tape feed operation of leading tape 16(1) and following tape 16(2) in tape feeder 8 are executed.

When carrier tape 16 is inserted from insertion port 8d and the insertion of carrier tape 16 is detected by encoder 28 in a state in which tape guideway 8c of tape feeder 8 is empty, feeder controller 21 starts driving second motor E2 in the forward rotation mode. Accordingly, the inserted carrier tape 16 is fed downstream. In other words, tape feeder 8 (the component supply unit) automatically transfers the mounted carrier tape 16 (leading tape 16(1)) into tape feeder 8. When the leading portion of leading tape 16(1) which is transferred downstream is detected by first sensor S1 in first detection position P1, feeder controller 21 stops the driving of second motor E2. In other words, leading tape 16(1) stops moving when the leading portion of leading tape 16(1) reaches first detection position P1.

In a case in which following tape 16(2) is inserted through insertion port 8d in a state in which the rear end of leading tape 16(1) which is mounted in tape feeder 8 is positioned on the upstream side (insertion port 8d side) of stopper member 26a, leading portion of following tape 16(2) abuts stopper member 26a. Accordingly, following tape 16(2) is prevented from entering tape feeder 8 and third sensor S3 detects that the leading portion of following tape 16(2) abuts stopper member 26a.

In FIG. 4, operation and display panel 29 which is disposed on the top surface of the upstream side of tape feeder 8 is connected to feeder controller 21. Operation and display panel 29 is provided with an operation button and a notification light. A worker inputs predetermined operations using the operation button, and the notification light is for notifying the worker of predetermined content. The worker is capable of performing recognition of the operational state of tape feeder 8 and inputting operation of predetermined items using operation and display panel 29.

Next, description will be given of cover tape peeling mechanism 30 provided on upper member 27b of retaining member 27 with reference to FIGS. 6A to 6D. Cover tape peeling mechanism 30 includes a function of peeling cover tape 16d from base tape 16c of carrier tape 16 to expose component D inside component pocket 16a. Cover tape peeling mechanism 30 peels cover tape 16d from a side (the right side toward the downstream side in FIGS. 6A to 6D) at which component pocket 16a is provided by interposing between the bonded surfaces of base tape 16c and cover tape 16d.

In FIG. 6A, peeling blade tip 30a (component exposing unit) is provided on the tip of the upstream side of cover tape peeling mechanism 30. Peeling blade tip 30a is thin and has a pointed tip. When the leading portion of carrier tape 16 reaches peeling blade tip 30a during the transfer to the downstream side, peeling blade tip 30a enters between the bonded surfaces of base tape 16c and cover tape 16d, and thus, the tape peeling is started. As illustrated in FIGS. 6B and 6C, the peeled area of cover tape 16d expands as carrier tape 16 is tape fed to the downstream side (arrow f, arrow g).

The peeled cover tape 16d bends along the curved surface of side end blade tip 30b, which is formed on the left side surface of cover tape peeling mechanism 30, toward the other side (the left side toward the downstream side in FIGS. 6A to 6D) opposite the first side. As illustrated in FIG. 6D, when carrier tape 16 is further tape fed (arrow h) and the adherence target component D reaches component pickup opening 27a which is provided corresponding to the component adherence position, cover tape 16d is folded back on a plane in relation to base tape 16c, and component D assumes an exposed state. In this manner, tape feeder 8 (the component supply unit) supplies component D which is exposed by carrier tape 16 to the component adherence position using peeling blade tip 30a (the component exposing unit).

Cover tape peeling mechanism 30 does not require prior preparation operations by the worker, and component D may be exposed by automatically peeling cover tape 16d from carrier tape 16 which is tape fed. For example, cover tape peeling mechanism 30 configured to cut open and peel the left and right of cover tape 16d of carrier tape 16 which is tape fed using a blade and to expose the component D may be adopted.

Figure 7:
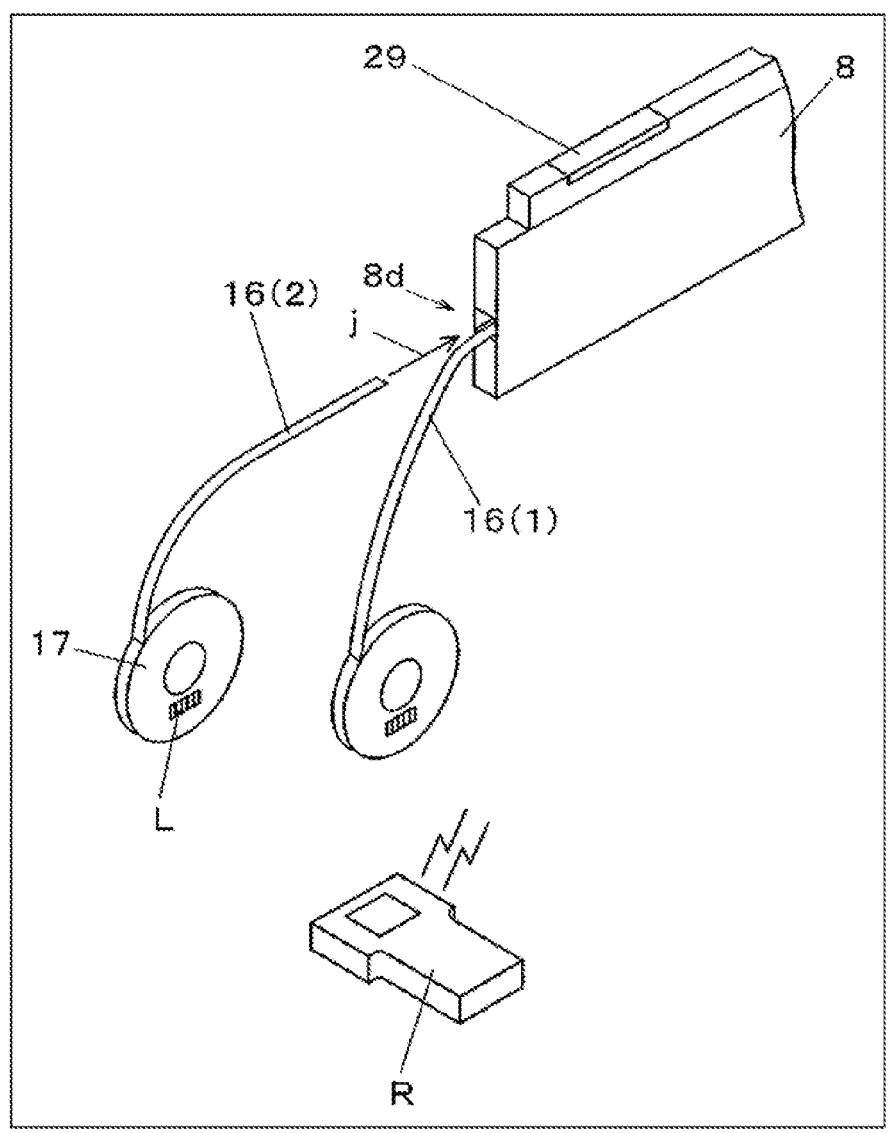
FIG. 7 is an explanation diagram of a loading operation of a carrier tape in the tape feeder of an embodiment of the present disclosure.

FIG. 7 illustrates an outline of component loading work in automatic loading tape feeder 8. In automatic loading tape feeder 8, following tape 16(2) is inserted (arrow j) into insertion port 8d of tape feeder 8 in a state in which leading tape 16(1) is mounted. Before inserting following tape 16(2) to be loaded into tape feeder 8, the worker reads bar-code label L (reel ID) which is attached, in advance, to the prepared supply reel 17 using bar-code reader R.

The reading result is transmitted to management computer 3 via wireless reception and transmission device 31 (refer to 9A), is further transmitted from management computer 3 to component mounters M2 to M4, and is subjected to a lookup process which is described later. In this manner, bar-code reader R is a reader which reads the reel ID (the identification information) attached to supply reel 17 (the reel) which stores carrier tape 16.

Figure 8:
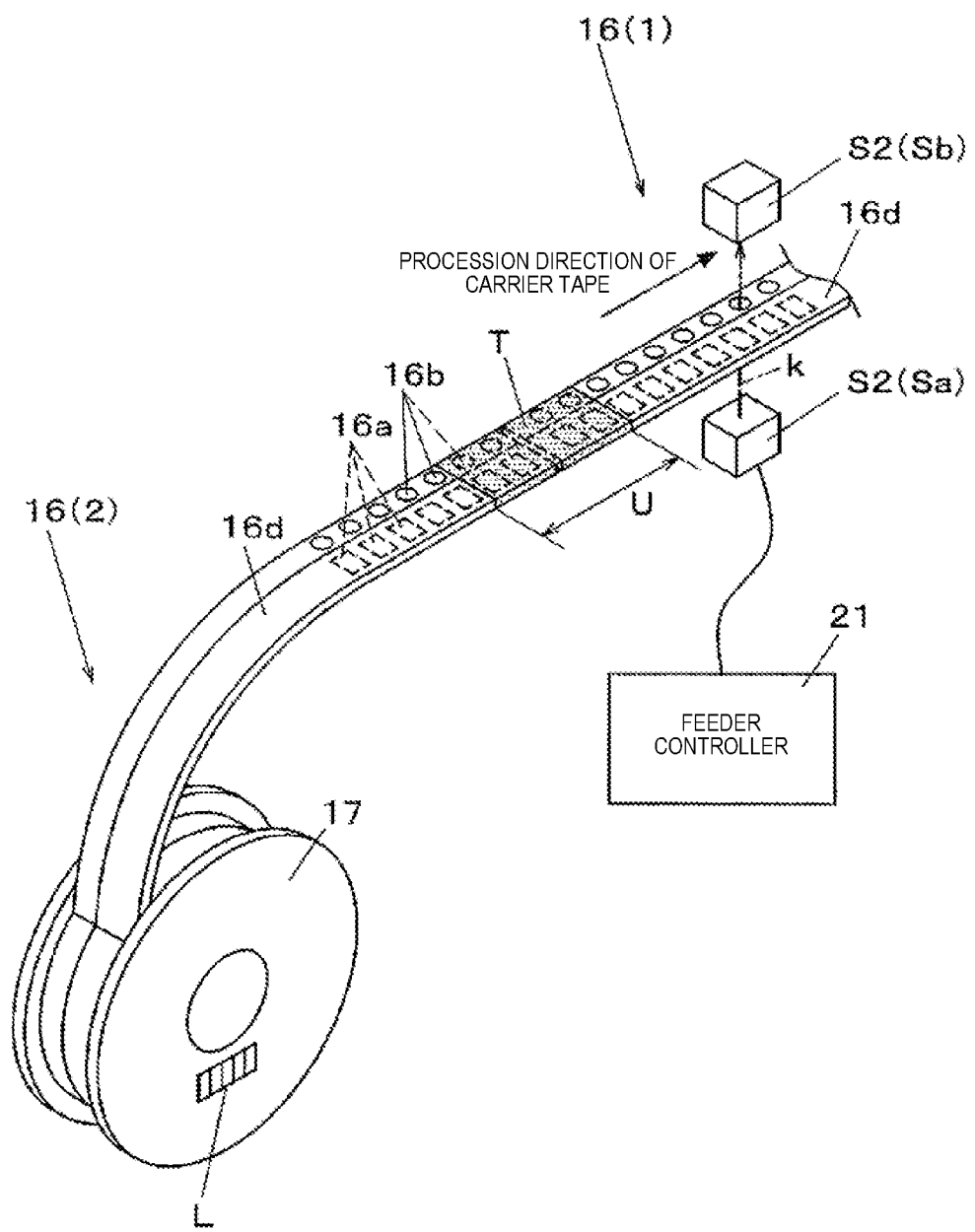
FIG. 8 is an explanation diagram of a detection operation of a joining of a spliced carrier tape of an embodiment of the present disclosure.

As illustrated in FIG. 8, in splicing system tape feeder 8 (not illustrated), when components D are consumed and little leading tape (1) which is supplied to tape feeder 8 remains, the component loading is performed using splicing. In the splicing, the tail end of leading tape 16(1) is caused to abut the leading end of following tape 16(2) to be newly loaded. Next, a splicing tape for joining is bonded to the obverse and the reverse of carrier tape 16 over a predetermined area interposing the abutting portion to form joining T. Accordingly, leading tape 16(1) is joined to following tape 16(2), and carrier tape 16 is continually pitch fed without interruption.

During the splicing, the worker reads bar-code label L (the reel ID) which is bonded, in advance, to supply reel 17 in which following tape 16(2) is stored using bar-code reader R. Subsequently, the lookup process which is described later is performed based on the reel ID which is read.

Incidentally, in component mounting line 1, there is a case in which automatic loading tape feeder 8 and splicing system tape feeder 8 are used in combination. There is a case in which the spliced carrier tape 16 is removed from tape feeder 8 and is secured in a state of being stored wound in supply reel 17. When carrier tape 16, which is spliced and secured, is unintentionally loaded into automatic loading tape feeder 8, cover tape 16d may not be properly peeled due to joining T, and peeling blade tip 30a of cover tape peeling mechanism 30 may be damaged.

In automatic loading tape feeder 8 of the present embodiment, second sensor S2 for detecting carrier tape 16 is provided at second detection position P2 on the upstream side of peeling blade tip 30a (refer to FIG. 4). As illustrated in FIG. 8, second sensor S2 (the sensor) is a transmissive sensor formed of irradiator Sa which irradiates beam k and detector Sb which detects the irradiated beam k. Second sensor S2 outputs detection signal N including a state in which beam k passes through feed hole 16b or the like, and a state in which beam k is not transmitted and is blocked. In this manner, second sensor S2 detects the light blocking state of carrier tape 16.

In addition to detecting whether or not carrier tape 16 is present depending on whether or not the light blocking state is present, second sensor S2 is capable of detecting joining T by subjecting the output detection signal N to a joining detection process using joining detector 21a (described later). In other words, tape feeder 8 (the component supply unit) includes second sensor S2 (the sensor) which detects joining T of carrier tape 16 mid way down tape guideway 8c which is the transfer path of carrier tape 16 at a position in front of peeling blade tip 30a (the component exposing unit). Second sensor S2 which detects joining T is changed, as appropriate, according to the type of the splicing tape which forms joining T. For example, in a case in which the splicing tape includes a metal thin film, a metal detecting sensor may be used as second sensor S2.

Figure 9A:
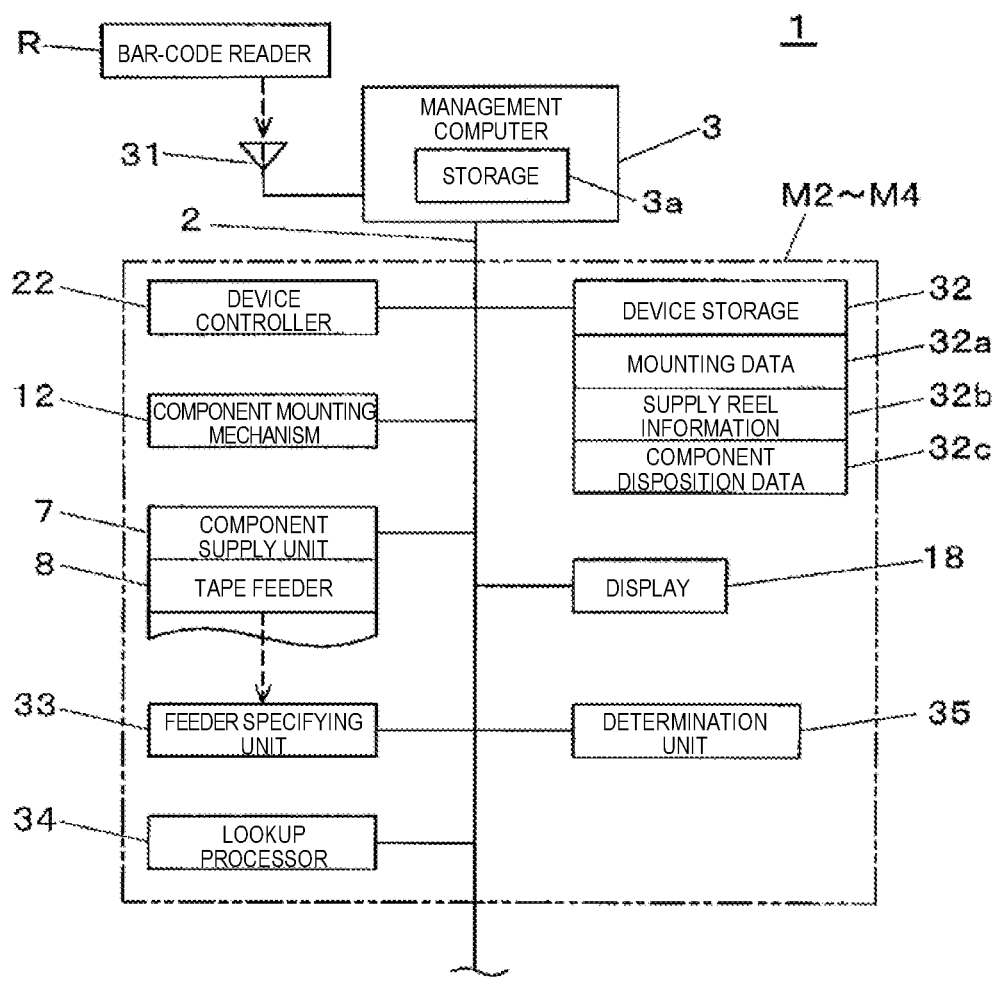
FIG. 9A is a diagram illustrating the overall configuration of a component supply system of an embodiment of the present disclosure.
Figure 9B:
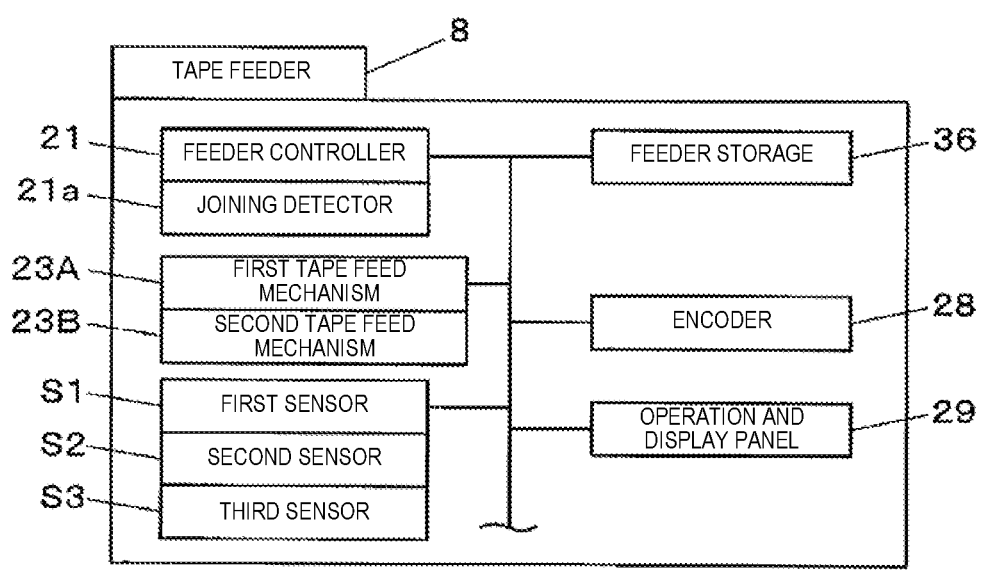
FIG. 9B is a diagram illustrating the configuration of the tape feeder of an embodiment of the present disclosure.

Next, description will be given of the configuration of the control system of the component supply system which limits the transferring of carrier tape 16 in a case in which joining T is present in component mounting line 1 and carrier tape 16 with reference to FIGS. 9A and 9B. FIG. 9A illustrates the overall configuration of a component supply system, and FIG. 9B illustrates the configuration of tape feeder 8, a plurality of which are mounted to each component supply unit 7 of component mounters M2 to M4.

In FIG. 9A, management computer 3 is connected to component mounters M2 to M4 using communication network 2. Management computer 3 includes wireless reception and transmission device 31 which receives a signal from a portable terminal such as bar-code reader R. Management computer 3 includes storage 3a, and various data such as production data used in the component mounting work by component mounters M2 to M4 is stored in storage 3a. In component mounting work of component mounters M2 to M4, the production data is downloaded from management computer 3 and stored in device storage 32, and operational information of component mounters M2 to M4 is collected by management computer 3. Bar-code reader R may be connected to each component mounter M2 to M4 in a wired manner.

Each component mounter M2 to M4 includes a device controller 22 which is a computational processor including a CPU function, and device controller 22 controls each of component mounting mechanism 12, component supply unit 7, and display 18 by executing a processing program which is stored in device storage 32. Device controller 22 (the controller) also controls the transfer of carrier tape 16 in tape feeder 8 (the component supply unit). Each component mounter M2 to M4 includes feeder specifying unit 33, lookup processor 34, and determination unit 35, which are information processors. During the control processes of device controller 22, the various production data such as mounting data 32a, supply reel information 32b, and component disposition data 32c which is stored in device storage 32 is looked up.

Mounting data 32a is data such as the component type of the component to be mounted and the mounting positional coordinates on the board, and is stored for each production-target board type. The supply reel information 32b is data correlating the reel ID (the identification information) of bar-code label L which is attached to supply reel 17 (the reel) which stored carrier tape 16 in a wound manner with the component ID which specifies components D which are stored in carrier tape 16. Component disposition data 32c is data defining the feeder address of tape feeder 8 in component supply unit 7, the feeder ID, and the reel ID of supply reel 17 which stores carrier tape 16 which is in a state of being supplied to tape feeder 8.

Here, description will be given of the configuration of supply reel information 32b and component disposition data 32c. FIG. 10A illustrates an example of supply reel information 32b. Two component IDs 42 of component ID 42(1) or component ID 42(2) specifying components D which are respectively stored in leading tape 16(1) or following tape 16(2) which is stored in supply reel 17 in a wound manner are stored in supply reel information 32b for each reel ID 41.

In FIG. 10A, carrier tapes 16 storing components D with component IDs 42(1) of T1aaa, T1bbb, and T1ddd are stored in supply reels 17 with reel IDs 41 of Raaaa, Rbbbb, and Rdddd, respectively, in a wound manner. Carrier tape 16 in which leading tape 16(1) is joined to following tape 16(2) by splicing is stored in supply reel 17 having reel ID 41 of Rcccc in a wound manner. Components D having component ID 42(1) of T1ccc are stored in leading tape 16(1), and components D having component ID 42(2) of T2ccc are stored in following tape 16(2).

In other words, according to supply reel information 32b, it may be understood that joining T is not present in carrier tape 16 which is stored in a wound manner in supply reels 17 with reel IDs 41 of Raaaa, Rbbbb, and Rdddd, and that joining T is present in carrier tape 16 which is stored in a wound manner in supply reel 17 with reel ID 41 of Rcccc. In this manner, reel ID 41 (the identification information) of supply reel 17 (the reel) is associated with the presence or absence of joining T of the stored carrier tape 16 and stored in supply reel information 32b.

FIG. 10B illustrates an example of component disposition data 32c. Tape feeders 8 with feeder IDs 44 of Faaaa and Fcccc are mounted in the positions at which feeder addresses 43 are f1 and f3, and carrier tapes 16 which are stored in supply reels 17 with reel IDs 41(1) of Raaaa and Rcccc are supplied. Tape feeder 8 with feeder ID 44 of Fbbbb is mounted in the position at which feeder address 43 is f2, carrier tape 16 which is stored in supply reel 17 with reel ID 41(1) of Rbbbb is supplied as leading tape 16(1), and carrier tape 16 which is stored in supply reel 17 with reel ID 41(2) of Rdddd is supplied as following tape 16(2).

In FIG. 9A, feeder specifying unit 33 specifies tape feeders 8 into which carrier tapes 16 are inserted and feeder addresses 43 in component supply unit 7 based on operation input information of operation and display panel 29 of tape feeder 8 by the worker, or based on rotation detection results of encoder 28 which is included in each tape feeder 8. Lookup processor 34 performs a lookup process of looking up reel ID 41 of supply reel 17 which is read by bar-code reader R against reel ID 41 of supply reel information 32b.

Lookup processor 34 correlates reel ID 41 which is looked up with tape feeder 8 which is specified by feeder specifying unit 33 and performs the disposition data update process of updating component disposition data 32c. Specifically, in a case in which carrier tape 16 is loaded in a state in which tape feeder 8 is vacant, in component disposition data 32c, "reel ID 41(1) of the leading tape" corresponding to feeder ID 44 of the specified tape feeder 8 is overwritten and updated with looked-up reel ID 41. In a case in which carrier tape 16 is loaded in a state in which leading tape 16(1) is supplied to tape feeder 8, "reel ID 41(2) of the following tape" corresponding to feeder ID 44 of the specified tape feeder 8 is overwritten and updated with looked-up reel ID 41.

During the splicing, lookup processor 34 performs a reel information update process of updating supply reel information 32b based on reel IDs 41 of leading tape 16(1) and following tape 16(2) which are looked up. Specifically, in supply reel information 32b, "component ID 42(2) of the following tape" corresponding to reel ID 41 of following tape 16(2) which is looked up is overwritten and updated with "component ID 42(1) of the leading tape" which is currently recorded. Subsequently, "component ID 42(1) of the leading tape" is overwritten and updated with "component ID 42(1) of the leading tape" of leading tape 16(1) which is looked up, and reel ID 41 of leading tape 16(1) which is looked up is erased.

In FIG. 9A, determination unit 35 performs a joining determination process of determining whether or not joining T of carrier tape 16 which is stored by supply reel 17 which is looked up is present based on supply reel information 32b. Specifically, whether or not joining T is present is determined from whether or not component IDs 42 of "component ID 42(1) of the leading tape" and "component ID 42(2) of the following tape" corresponding to reel ID 41 are present based on reel ID 41 (the identification information) which is read by bar-code reader R (the reader) and supply reel information 32b (the stored information) which is stored in device storage 32 (the storage). In other words, determination unit 35 is a joining determination unit which determines whether or not a joining which joins two carrier tapes 16, one after the other, is present in carrier tape 16.

Here, a configuration example is given in which feeder specifying unit 33, lookup processor 34, and determination unit 35 are processing functions of component mounters M2 to M4; however, these processing functions may be provided as processing functions of management computer 3. Display 18 displays various screens which are necessary in the execution of the component mounting work by component mounters M2 to M4. In a case in which it is determined that joining T is present in the joining determination process, the display screens serve as notification units which visually notify the worker with a warning. In addition to display 18, component mounting line 1 may be provided with a notification unit such as a display light or a buzzer which performs notification of a warning.

In FIG. 9B, feeder controller 21 (the controller) executes the processing program which is stored in feeder storage 36 and controls first tape feed mechanism 23A and second tape feed mechanism 23B, and thus, feeder controller 21 controls the transferring of carrier tape 16 in tape feeder 8 (the component supply unit). The control is performed based on control signals from component mounters M2 to M4, operation input from operation and display panel 29, and signals from encoder 28, first sensor S1, second sensor S2, and third sensor S3 which are embedded in sprocket 24B. Feeder controller 21 includes joining detector 21a as an internal processing function. Joining detector 21a processes detection signal N which is detected by second sensor S2, and performs joining detection process of detecting whether or not joining T formed by splicing is present.

In the joining detection process, joining detector 21a obtains light blocking length U (refer to FIG. 8) for which feed hole 16b is continuously not detected by computation from the tape feed state of carrier tape 16 and the continuation time of the light blocking state of detection signal N. In other words, joining detector 21a is a computer which computes light blocking length U in a case in which the light blocking state is detected by second sensor S2 (the sensor). Joining detector 21a determines that joining T is present in a case in which light blocking length U exceeds the length of the splicing tape which is a threshold. In other words, joining detector 21a (the joining determination unit) determines whether or not joining T is present based on detection signal N (the detection information) of second sensor S2 and serves as a joining determination unit which determines that joining T is present in a case in which light blocking length U exceeds the threshold.

First Embodiment

Figure 11:
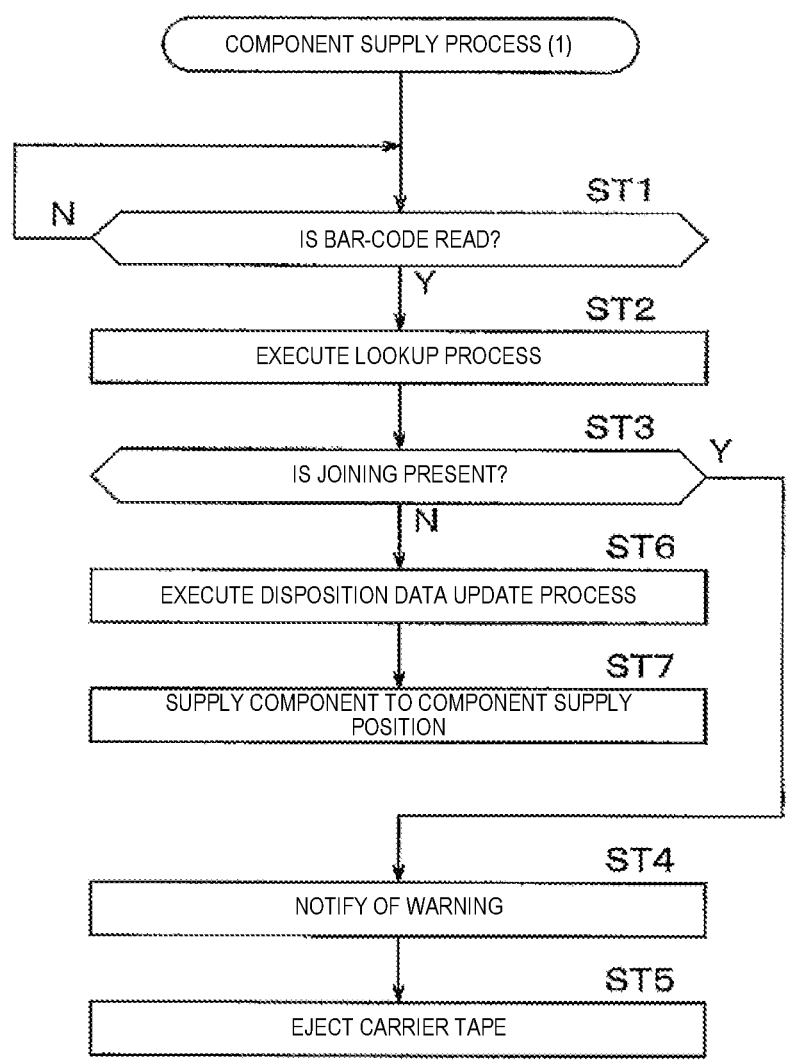
FIG. 11 is a flowchart of a component supply method of a first embodiment according to an embodiment of the present disclosure.

Next, in line with the flowchart of FIG. 11, description will be given of a component supply process (the component supply method) in which the transferring of carrier tape 16 is restricted in a case in which joining T of component mounting line 1 (the component supply system) of the first embodiment is present. In the present embodiment, whether or not joining T is present is determined based on reel ID 41 which is read by bar-code reader R. First, when reel ID 41 of supply reel 17 which stores carrier tape 16 to be loaded into tape feeder 8 in a wound state is read by bar-code reader R (Yes in ST1), lookup processor 34 executes the lookup process of looking up reel ID 41 which is read against reel ID 41 of supply reel information 32b which is stored (ST2: lookup process procedure).

Next, determination unit 35 performs a joining determination process of determining whether or not joining T of carrier tape 16 which is looked up is present based on component ID 42 corresponding to reel ID 41 of supply reel information 32b which is looked up (ST3: joining determination procedure). In a case in which determination unit 35 (the joining determination unit) determines that joining T is present (Yes in ST3), device controller 22 (the controller) notifies display 18 (notification unit) of a warning (ST4: notification procedure). In a case in which carrier tape 16 with joining T is inserted into tape feeder 8, device controller 22 transfers a control signal causing sprocket 24B to be driven in the reverse rotation mode and causes carrier tape 16 to be ejected from tape feeder 8 (ST5). In other words, joining T is transferred to visible position V (refer to FIG. 13B) which is visible to the naked eye.

In a case in which determination unit 35 (the joining determination unit) determines that joining T is not present (No in ST3), lookup processor 34 performs the disposition data update process of updating component disposition data 32c (ST6), and device controller 22 transfers carrier tape 16 which is loaded to the component adherence position according to a control pattern which is set in advance (ST7).

In the present embodiment, in a case in which it is determined that joining T is present, device controller 22 (the controller) restricts the transferring of carrier tape 16 such that joining T is not transferred to peeling blade tip 30a (the component exposing unit) of cover tape peeling mechanism 30 by performing notification of a warning, ejection of carrier tape 16, or the like. Accordingly, it is possible to prevent abnormalities in the transferring of carrier tape 16 such as damage to peeling blade tip 30a caused by joining T of carrier tape 16.

Even if carrier tape 16 is inserted and automatically transferred into tape feeder 8 before lookup process procedure (ST2), the movement of carrier tape 16 stops temporarily when the leading portion reaches first detection position P1 of the upstream side of peeling blade tip 30a. Therefore, in a case in which it is subsequently determined that joining T is present, it is possible to prevent abnormality in the transferring of carrier tape 16 such as damage to peeling blade tip 30a caused by joining T by restricting transferring beyond first detection position P1.

Second Embodiment

Figure 12:
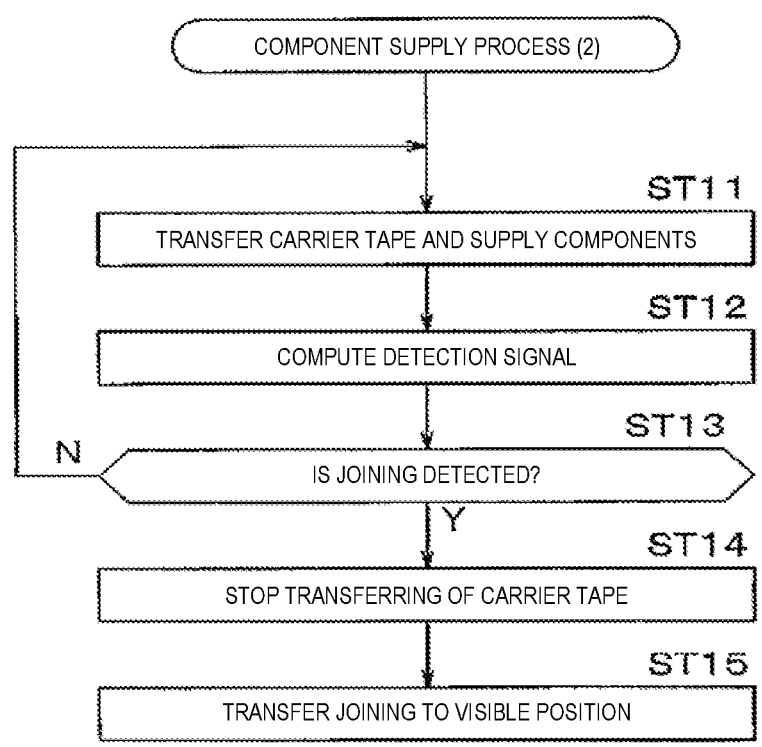
FIG. 12 is a flowchart of a component supply method of a second embodiment according to an embodiment of the present disclosure.
Figure 13A:
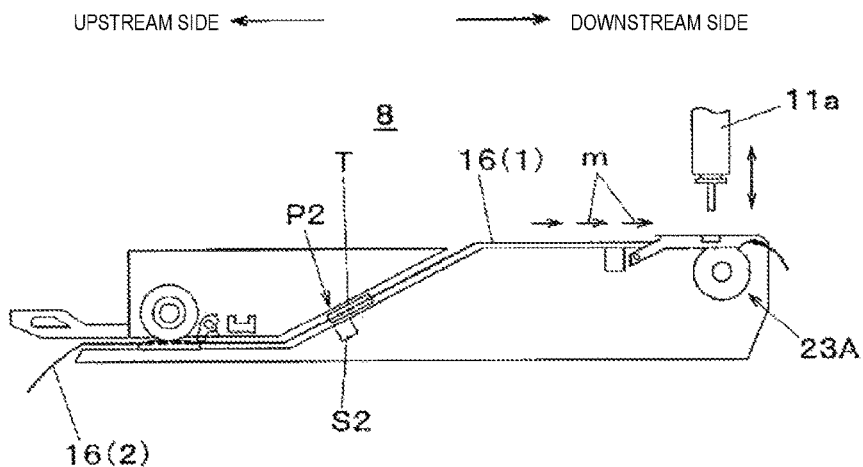
FIG. 13A is a procedure explanation diagram of the component supply method of the second embodiment according to an embodiment of the present disclosure.
Figure 13B:
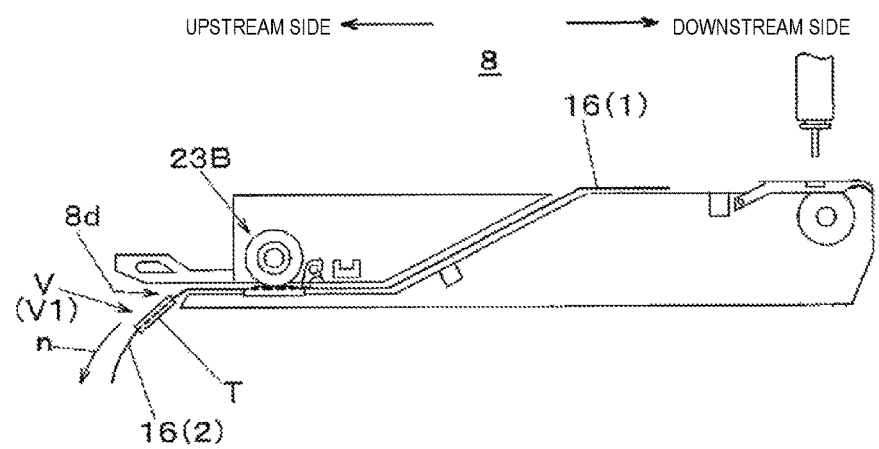
FIG. 13B is a procedure explanation diagram of the component supply method of the second embodiment according to an embodiment of the present disclosure.
Figure 13C:
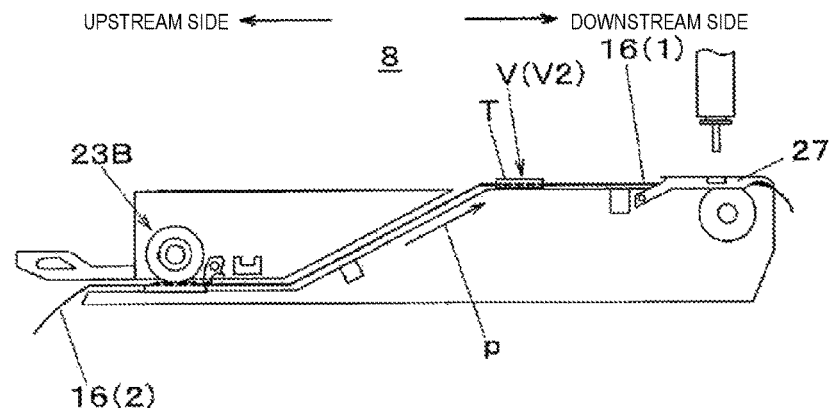
FIG. 13C is a procedure explanation diagram of the component supply method of the second embodiment according to an embodiment of the present disclosure.

Next, in line with the flowchart of FIG. 12, description will be given of a component supply process (the component supply method) in which the transferring of carrier tape 16 is restricted in a case in which joining T of component mounting line 1 (the component supply system) of the second embodiment is present with reference to FIGS. 13A to 13C. In the present embodiment, whether or not joining T is present is determined based on detection signal N (the detection information) of second sensor S2. In FIG. 13A, tape feeder 8 pitch feeds (arrow m) leading tape 16(1) of carrier tape 16 and supplies component D which is exposed by peeling blade tip 30a of cover tape peeling mechanism 30 to the component adherence position (ST11).

In this state, joining detector 21a obtains light blocking length U by computing detection signal N of second sensor S2 every time carrier tape 16 is pitch fed (ST12), and performs the joining detection process of detecting whether or not joining T is present (ST13: joining detection procedure). In a case in which joining detector 21a (the joining determination unit) determines that joining T is present (Yes in ST13), feeder controller 21 stops the pitch feeding of carrier tape 16 (ST14). Next, feeder controller 21 controls second tape feed mechanism 23B and transfers joining T to visible position V which is visible to the worker (ST15: joining transfer procedure). At this time, the worker may be notified of a warning by displaying the fact that joining T is present in carrier tape 16 on operation and display panel 29 or displays 18 of component mounters M2 to M4.

Visible position V may be anywhere at which joining T is in front of peeling blade tip 30a of cover tape peeling mechanism 30 and at which the worker is capable of visually confirming joining T. In the example of FIG. 13B, carrier tape 16 is transferred to the upstream side using the reverse rotation mode (arrow n), and joining T is transferred to visible position V1 of the upstream side of insertion port 8d. In the example of FIG. 13C, carrier tape 16 is transferred to the downstream side using the forward rotation mode (arrow p), and carrier tape 16 is transferred to visible position V2 in front of peeling blade tip 30a on the top portion of tape feeder 8. In joining detection procedure (ST13), in a case in which it is determined that joining T is not present (No in ST13), the procedure returns to ST11 and the component supply continues.

In the present embodiment, in a case in which joining detector 21a (the joining determination unit) determines that joining T is present, feeder controller 21 (the controller) stops the transferring of carrier tape 16 at a position at which joining T is in front of peeling blade tip 30a (the component exposing unit). Accordingly, it is possible to prevent abnormalities in the transferring of carrier tape 16 such as damage to peeling blade tip 30a caused by joining T of carrier tape 16. By automatically transferring joining T to visible position V, the worker is able to easily visually confirm whether or not joining T is present without performing additional operations.

As described above, in a case in which a component supply system and a component supply method of the present embodiment determine whether or not joining T of carrier tape 16 is present and determine that joining T is present, the transfer of the carrier tape is restricted. Accordingly, it is possible to prevent abnormalities in the transferring of carrier tape 16 such as damage to peeling blade tip 30a caused by joining T of carrier tape 16.

In other words, the component supply system and the component supply method of the present disclosure include tape feeder 8 which stores components D and is covered with cover tape 16d, exposes components D from leading tape 16(1) using peeling blade tip 30a, and supplies components D which are exposed from leading tape 16(1), determination unit 35 which determines whether or not joining T which joins following tape 16(2) positioned behind leading tape 16(1) to leading tape 16(1) is present, and device controller 22 which controls transferring of leading tape 16(1) by tape feeder 8. Device controller 22 restricts the transferring of leading tape 16(1) in a case in which determination unit 35 determines that joining T is present. Accordingly, in the automatic loading tape feeder, it is possible to prevent the occurrence of abnormalities in the transferring of the carrier tape.

The component supply system and the component supply method of the present disclosure have the effect of being capable of preventing erroneous transferring of the carrier tape in the automatic loading tape feeder, and are applicable to the field of component mounting in which components taken from a tape feeder disposed in a component supply unit are transferred to and placed on aboard.

What is claimed is:

1. A component supply system, comprising:
   a component supply unit that automatically transfers a first carrier tape which stores components and is covered with a cover tape, exposes the components from the first carrier tape using a component exposing unit, and supplies the components which are exposed from the first carrier tape;
   a joining determination unit which determines whether or not a joining is present, wherein the joining is a joint, formed by splicing, that joins the first carrier tape to a second carrier tape positioned behind the first carrier tape; and
   a controller which controls transferring of the first carrier tape by the component supply unit,
   wherein the controller restricts the transferring of the first carrier tape in a case in which the joining determination unit determines that the joining is present,
   wherein the component supply unit includes a sensor which detects the joining mid way down a transfer path of the first carrier tape at a position in front of the component exposing unit,
   wherein the joining determination unit determines whether or not the joining is present based on detection information of the sensor, and
   wherein the controller stops transferring of the first carrier tape at a position at which the joining is in front of the component exposing unit in the case in which the joining determination unit determines that the joining is present.

2. The component supply system of claim 1, further comprising:
   a reader which reads identification information attached to a reel which stores the first carrier tape;
   a storage which associates and stores the identification information attached to the reel with presence or absence of the joining; and
   a notification unit which performs notification of an occurrence of an abnormality,
   wherein the joining determination unit determines whether or not the joining is present based on the identification information which is read by the reader and information stored in the storage, and
   wherein the controller causes the notification unit to perform notification of a warning in the case in which the joining determination unit determines that the joining is present.

3. The component supply system of claim 1,
wherein the joining is transferred to a visible position in the case in which the joining determination unit determines that the joining is present.

4. The component supply system of claim 1,
wherein the sensor is a transmitting sensor which detects a light blocking state of the first carrier tape,
wherein the component supply unit further includes a computer which computes a light blocking length in the case in which the light blocking state is detected by the sensor, and
wherein the joining determination unit determines that the joining is present in a the case in which the light blocking length exceeds a threshold.

5. The component supply system of claim 1,
wherein the controller inhibits the forward transferring of the first carrier tape in the case in which the joining determination unit determines that the joining is present.

6. The component supply system of claim 5,
wherein the controller restricts transfer of the first carrier tape such that the joining is not transferred to the component exposing unit in the case in which the joining determination unit determines that the joining is present.

7. The component supply system of claim 6,
wherein the joining is transferred using a reverse rotation mode to an upstream side of an insertion port of the component supply unit.

8. The component supply system of claim 6,
wherein the joining is transferred using a forward rotation mode to the position in front of the component exposing unit in the case in which the joining determination unit determines that the joining is present.

9. A component supply method in a component supply system including a component supply unit automatically transfers a first carrier tape which stores components and is covered with a cover tape, exposes the components from the first carrier tape using a component exposing unit, and supplies the components which are exposed from the first carrier tape, the method comprising:
   determining whether or not a joining is present, wherein the joining is a joint, formed by splicing, that joins the first carrier tape to a second carrier tape positioned behind the first carrier tape; and
   restricting transferring of the first carrier tape in a case in which the joining is determined to be present,
   wherein the component supply unit includes a sensor which detects the joining mid way down a transfer path of the first carrier tape at a position in front of the component exposing unit,
   wherein a joining determination unit determines whether or not the joining is present based on detection information of the sensor, and
   wherein a controller stops transferring of the first carrier tape at a position at which the joining is in front of the component exposing unit in the case in which the joining determination unit determines that the joining is present.

10. The component supply method of claim 9,
wherein the component supply system further includes
a reader which reads identification information attached to a reel which stores the first carrier tape,
a storage which associates and stores the identification information of the reel with presence or absence of the joining, and
a notification unit which performs notification of a warning,
wherein it is determined whether or not the joining is present based on the identification information which is read by the reader and information stored in the storage, and
wherein the notification unit performs notification of the warning in a the case in which the joining is determined to be present.

11. The component supply method of claim 9,
wherein the joining is transferred to a visible position in the case in which the joining is determined to be present.

12. The component supply method of claim 9,
wherein forward transfer of the first carrier tape is inhibited in the case in which the joining is determined to be present.

13. The component supply method of claim 12,
wherein transfer of the first carrier tape is restricted such that the joining is not transferred to the component exposing unit in the case in which the joining is determined to be present.

14. The component supply method of claim 13,
wherein the joining is transferred using a reverse rotation mode to an upstream side of an insertion port of the component supply unit in the case in which the joining is determined to be present.

15. The component supply method of claim 13,
wherein the joining is transferred using a forward rotation mode to the position in front of the component exposing unit in the case in which the joining is determined to be present.

* * * * *